United States Patent
Lee et al.

(10) Patent No.: US 7,825,742 B2
(45) Date of Patent: Nov. 2, 2010

(54) OSCILLATOR WITH A LOW POWER CONSUMPTION

(75) Inventors: Tung-Teh Lee, Taipei (TW); Shih-Neng Huang, Shulin (TW); Wen-Jung Huang, Shulin (TW)

(73) Assignee: Taitien Electronics Co., Ltd., Taipei (TW)

( * ) Notice: Subject to any disclaimer, the term of this patent is extended or adjusted under 35 U.S.C. 154(b) by 191 days.

(21) Appl. No.: 12/194,257

(22) Filed: Aug. 19, 2008

(65) Prior Publication Data

US 2009/0256641 A1    Oct. 15, 2009

(30) Foreign Application Priority Data

Apr. 10, 2008    (TW) .............................. 97112994 A

(51) Int. Cl.
*H03B 5/32* (2006.01)
(52) U.S. Cl. .......................... 331/158; 313/176; 313/66
(58) Field of Classification Search ................ 331/158, 331/176, 66
See application file for complete search history.

(56) References Cited

U.S. PATENT DOCUMENTS 6,049,256 A * 4/2000 Fry .............................. 331/69

* cited by examiner

*Primary Examiner*—Arnold Kinkead
(74) *Attorney, Agent, or Firm*—Vedder Price, P.C.

(57) ABSTRACT

A package device, such as an oscillator, includes a package module, a circuit module, a plurality of conductive pins, and a plurality of conductive arms. The package module defines an airtight space therein. The circuit module is disposed in the airtight space in the package module. Each of the conductive pins extends into the airtight space in the package module. Each of the conductive arms is disposed in the airtight space, and has a first end that is connected to the circuit module, a second end that is connected to a respective one of the conductive pins, and an intermediate portion that extends between the first and second ends thereof and that has a length longer than the shortest distance between the first and second ends thereof.

8 Claims, 4 Drawing Sheets

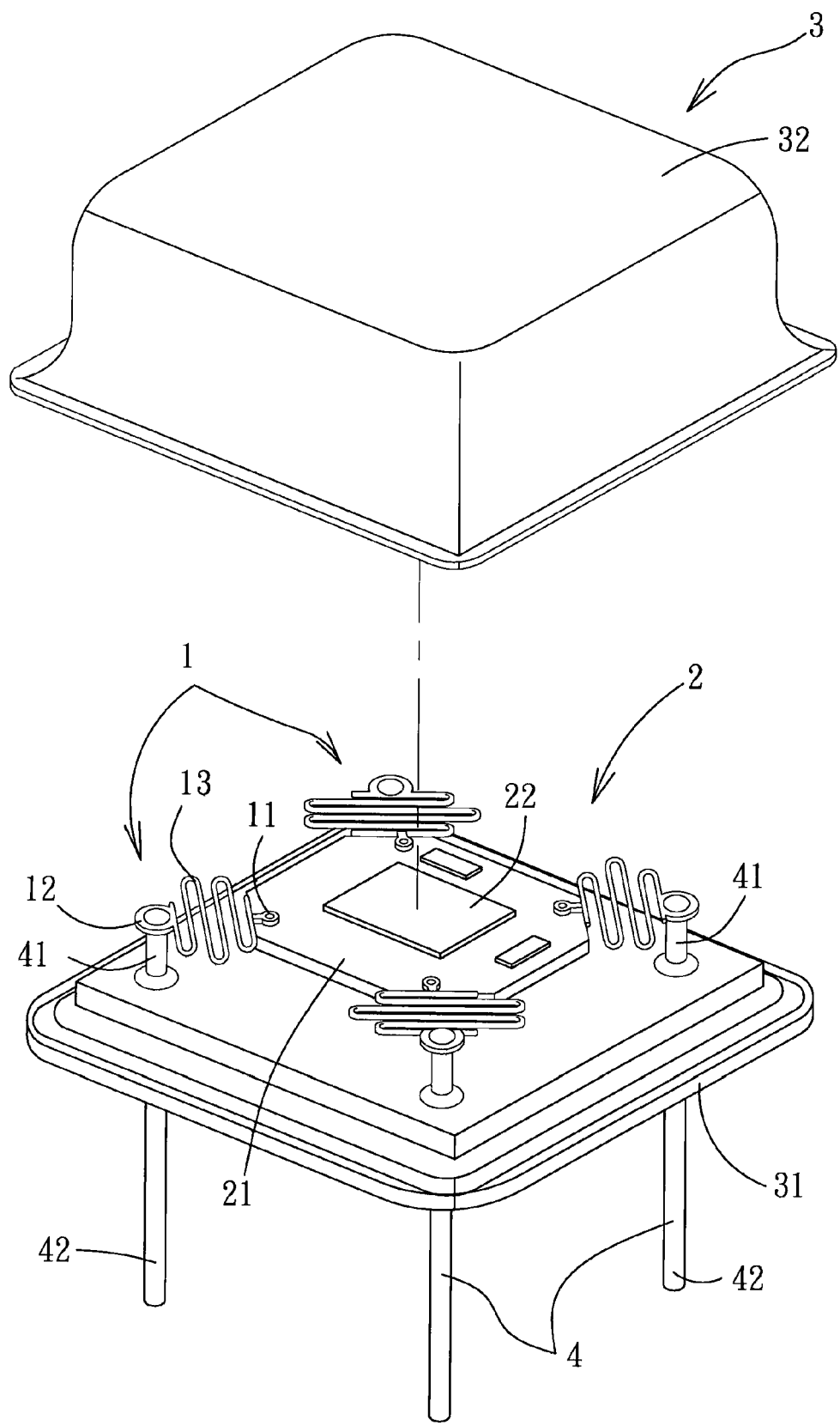
F I G. 2

OSCILLATOR WITH A LOW POWER CONSUMPTION

CROSS-REFERENCE TO RELATED APPLICATION

This application claims priority of Taiwanese application no. 097112994, filed on Apr. 10, 2008.

BACKGROUND OF THE INVENTION

1. Field of the Invention

This invention relates to an oscillator, more particularly to a temperature-controlled type oscillator.

2. Description of the Related Art

Crystal oscillators are applied as a reference frequency source not only in wireless communications systems, but also in mobile phones, personal digital assistants (PDA), and notebook computers. A crystal oscillator can be of the well-known quartz crystal oscillator. The resonant frequency of the quartz crystal oscillator, however, varies with temperature. To solve this problem, it has been proposed to use temperature-controlled type oscillators, such as an oven-controlled crystal oscillator (OCXO) or a temperature-compensated crystal oscillator (TCXO).

FIG. 1 illustrates a conventional OCXO 9 that includes a package module 91, a circuit module 92, and a plurality of conductive pins 94. The package module 91 includes a metallic cover 911, and a metallic base 912 that is attached to the metallic cover 911, and that cooperates with the metallic cover 911 to define an airtight space 90 therebetween. The circuit module 92 is disposed in the airtight space 90 in the package module 91, and includes a dielectric substrate 921, a heating controller circuit 923, and a crystal resonator 922. The dielectric substrate 921 is attached to the metallic cover 911 of the package module 91 and has opposite first and second surfaces. The heating controller circuit 923 is mounted on the first surface of the dielectric substrate 921, and is operable so as to generate heat in order to maintain the airtight space 90 in the package module 91 at an operating temperature. The crystal resonator 922 is mounted on the second surface of the dielectric substrate 921 and is operable at a resonant frequency. Each of the conductive pins 94 extends into the airtight space 90 through the metallic base 912 of the package module 91, and is connected to the dielectric substrate 921 and the crystal resonator 922 of the circuit module 92. The airtight space 90 in the package module 91 is filled with a foam material 97 to thereby reduce radiation of the heat generated by the heating controller circuit 923 of the circuit module 92 through the package module 91.

The aforementioned conventional OCXO 9 is disadvantageous in that, since the heat generated by the heating controller circuit 923 of the circuit module 92 is nevertheless radiated out of the package module 91 through the conductive pins 94, which therefore requires frequent operation of the heating controller circuit 923 of the circuit module 92, the conventional OCXO 9 consumes a large power.

SUMMARY OF THE INVENTION

Therefore, the main object of the present invention is to provide a low-power-consumption package device.

Another object of the present invention is to provide a low-power-consumption oscillator.

According to an aspect of the present invention, a package device comprises a package module, a circuit module, a plurality of conductive pins, and a plurality of conductive arms. The package module includes a cover, and a base that is attached to the cover, and that cooperates with the cover to define an airtight space therebetween. The circuit module is disposed in the airtight space in the package module, and is operable so as to generate heat in order to maintain the airtight space in the package module at an operating temperature. Each of the conductive pins extends into the airtight space in the package module through the base of the package module. Each of the conductive arms is disposed in the airtight space in the package module, and has a first end that is connected to the circuit module, a second end that is connected to a respective one of the conductive pins, and an intermediate portion that extends between the first and second ends thereof and that has a length longer than the shortest distance between the first and second ends thereof.

According to another aspect of the present invention, an oscillator comprises a package module, a circuit module, a plurality of conductive pins, and a plurality of conductive arms. The package module includes a cover, and a base that is attached to the cover, and that cooperates with the cover to define an airtight space therebetween. The circuit module is disposed in the airtight space in the package module, and includes a dielectric substrate, a crystal resonator that is mounted on the dielectric substrate and that is operable at a resonant frequency, and a heating controller circuit that is mounted on the dielectric substrate, and that is operable so as to generate heat in order to maintain the airtight space in the package module at an operating temperature. Each of the conductive pins extends into the airtight space in the package module through the base of the package module. Each of the conductive arms is disposed in the airtight space in the package module, and has a first end that is connected to the dielectric substrate and the crystal resonator of the circuit module, a second end that is connected to a respective one of the conductive pins, and an intermediate portion that extends between the first and second ends thereof and that has a length longer than the shortest distance between the first and second ends thereof.

BRIEF DESCRIPTION OF THE DRAWINGS

Other features and advantages of the present invention will become apparent in the following detailed description of the preferred embodiment with reference to the accompanying drawings, of which:

FIG. 2 is a partly exploded perspective view of the preferred embodiment of a package device according to this invention;

DETAILED DESCRIPTION OF THE PREFERRED EMBODIMENT

Figure 1:
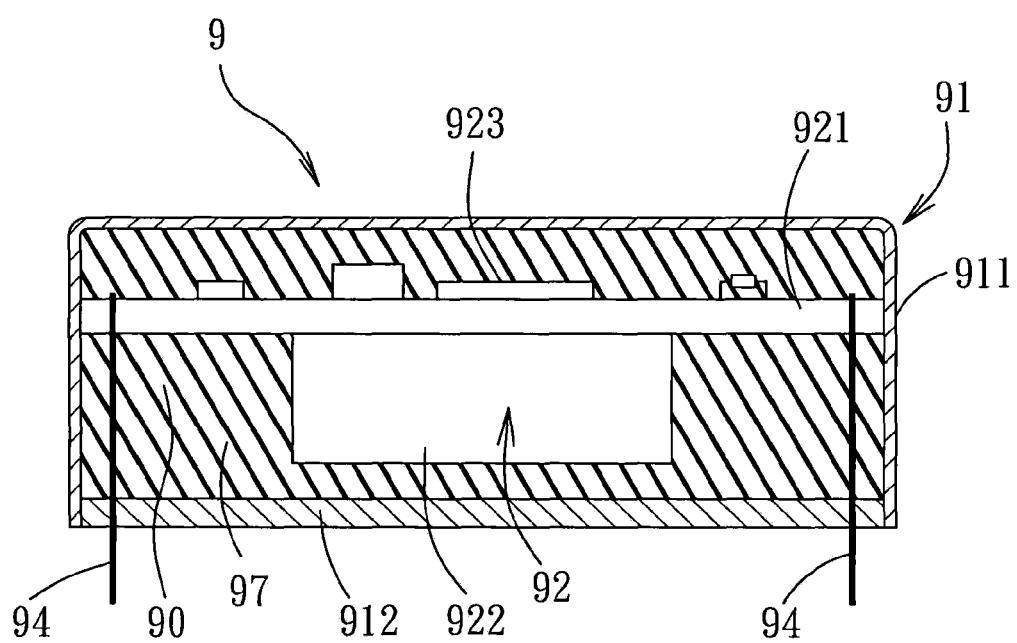
FIG. 1 is a schematic sectional view of a conventional oven-controlled crystal oscillator (OCXO)
Figure 3:
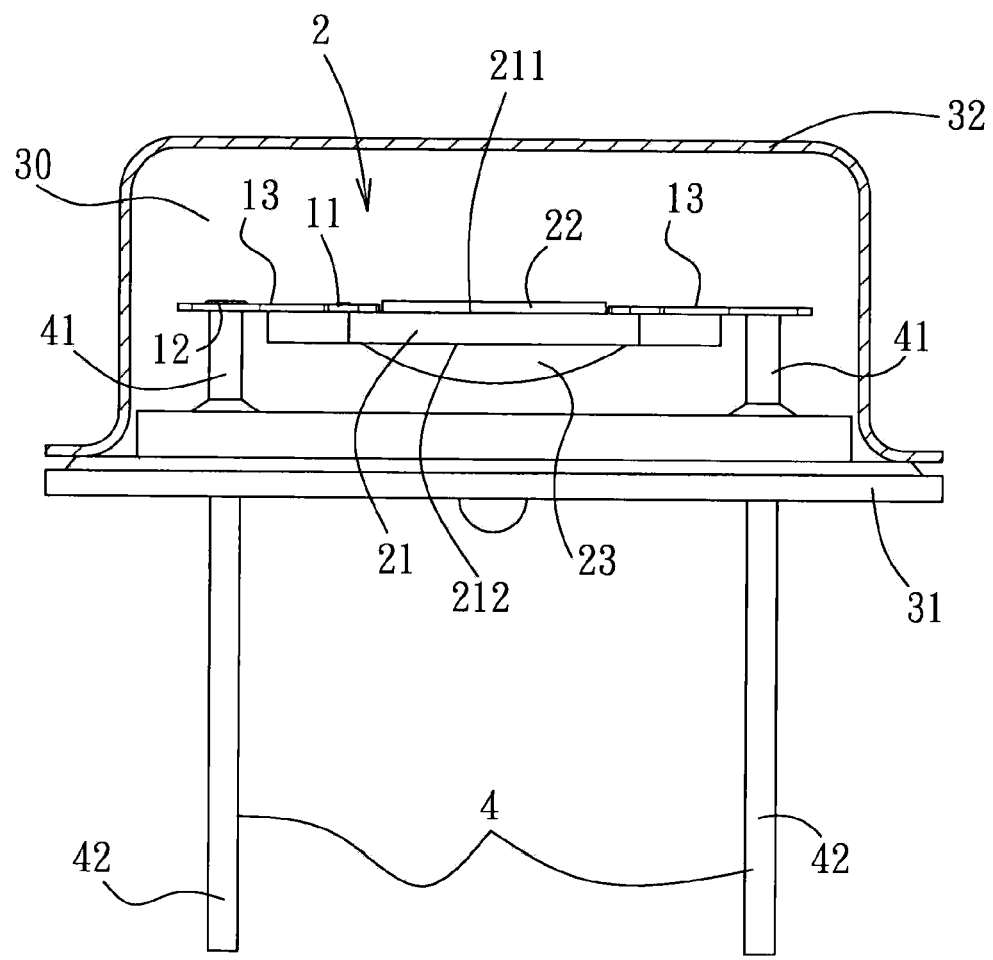
FIG. 3 is a partly sectional view illustrating a circuit module of the preferred embodiment.

Referring to FIGS. 2 and 3, the preferred embodiment of a package device according to this invention is shown to include a package module 3, a circuit module 2, a plurality of conductive pins 4, and a plurality of conductive arms 1.

The package device of this embodiment is applied to a temperature-compensated type oscillator.

The package module 3 includes a cover 32, and a base 31 that is attached, such as by seam-sealing technique, to the cover 32, and that cooperates with the cover 32 to define an airtight space 30 therebetween. In this embodiment, each of the cover 32 and the base 31 is made from a metallic material.

The circuit module 2 is disposed in the airtight space 30 in the package module 3, and includes a dielectric substrate 21, a crystal resonator 22, and a heating controller circuit 23. The dielectric substrate 21 has opposite first and second surfaces 211, 212. The crystal resonator 22 is mounted on the first surface 211 of the dielectric substrate 21 and is operable at a resonant frequency. The heating controller circuit 23, which includes a controller chip (not shown), is mounted on the second surface 212 of the dielectric substrate 21, and is operable so as to generate heat in order to maintain the airtight space 30 in the package module 3 at an operating temperature. In this embodiment, the circuit is module 2 is spaced apart from the cover 32 and the base 31 of the package module 3. Moreover, in this embodiment, the heating controller circuit 23 operates based on a user setting and variations of the temperature in the airtight space 30 in the package module 3.

It is noted that the base 31 of the package module 3 has an inner surface that is coated with a gold plating layer (not shown), thereby reducing radiation of the heat generated by the heating controller circuit 23 of the circuit module 2 through the package module 3.

In an alternative embodiment, the crystal resonator 22 is mounted on the second surface 212 of the dielectric substrate 21, and the heating controller circuit 23 is mounted on the first surface 211 of the dielectric substrate 21.

In yet another embodiment, the crystal resonator 22 and the heating controller circuit 23 are mounted on the first surface 211 of the dielectric substrate 21.

In still another embodiment, the crystal resonator 22 and the heating controller circuit 23 are mounted on the second surface 212 of the dielectric substrate 21.

Each of the conductive pins 4 extends through the base 31 of the package module 3, and has a first end portion 41 that is disposed in the airtight space 30 in the package module 3, and a second end portion 42 that is disposed externally of the package module 3.

Each of the conductive arms 1 is disposed in the airtight space 30 in the package module 3, and has a first end 11 that is connected to the dielectric substrate 21 and the crystal resonator 22 of the circuit module 2, a second end 12 that is connected to the first end portion 41 of a respective one of the conductive pins 4, and an intermediate portion 13 that extends between the first and second ends 11, 12 thereof.

Figure 4:
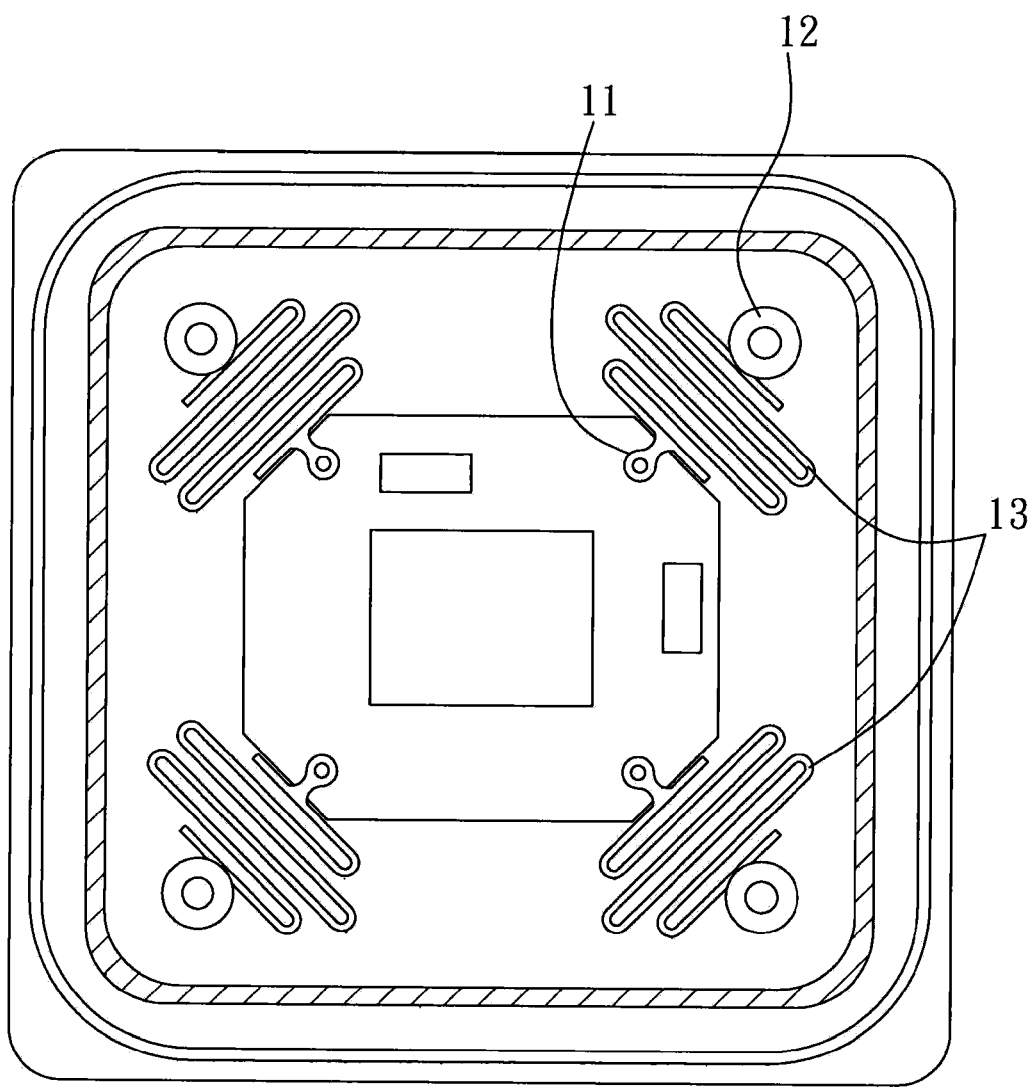
FIG. 4 is a partly sectional view illustrating conductive arms of the preferred embodiment.

With further reference to FIG. 4, in this embodiment, the intermediate portion 13 of each of the conductive arms 1 has a length longer than the shortest distance between the first and second ends 11, 12 of a respective one of the conductive arms 1. Preferably, the intermediate portion 13 of each of the conductive arms 1 has a meandering shape. Moreover, in this embodiment, each of the conductive arms 1 is made from metal or an alloy, such as a copper-nickel alloy. Further, in this embodiment, each of the conductive arms 1 has a high electrical conductivity and a low heat conductivity. The construction of the conductive arms 1 as such reduces radiation of the heat generated by the heating controller circuit 23 of the circuit module 2 out of the package module 3 through the conductive pins 4, and thus minimizes the frequency and shortens the operation of the heating controller circuit 23 of the circuit module 2. As a result, a low power consumption for the temperature-compensated type oscillator of this invention is achieved.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A package device, comprising:
   a package module including
      a cover, and
      a base that is attached to said cover, and that cooperates with said cover to define an airtight space therebetween;
   a circuit module disposed in said airtight space in said package module, and operable so as to generate heat in order to maintain said airtight space in said package module at an operating temperature;
   a plurality of conductive pins, each of which extends into said airtight space in said package module through said base of said package module; and
   a plurality of conductive arms disposed in said airtight space in said package module, each of said conductive arms having a first end that is connected to said circuit module, a second end that is connected to a respective one of said conductive pins, and an intermediate portion that extends between said first and second ends thereof and that has a length longer than the shortest distance between said first and second ends thereof, wherein each of said conductive arms is made from a metallic material and has a low heat conductivity.

2. The package device as claimed in claim 1, wherein said intermediate portion of each of said conductive arms has a meandering shape.

3. The package device as claimed in claim 1, wherein said circuit module is spaced apart from said cover and said base of said package module.

4. An oscillator, comprising:
   a package module including
      a cover, and
      a base that is attached to said cover, and that cooperates with said cover to define an airtight space therebetween;
   a circuit module disposed in said airtight space in said package module, and including
      a dielectric substrate,
      a crystal resonator that is mounted on said dielectric substrate and that is operable at a resonant frequency, and
      a heating controller circuit that is mounted on said dielectric substrate, and that is operable so as to generate heat in order to maintain said airtight space in said package module at an operating temperature;
   a plurality of conductive pins, each of which extends into said airtight space in said package module through said base of said package module; and
   a plurality of conductive arms disposed in said airtight space in said package module, each of said conductive arms having a first end that is connected to said dielectric substrate and said crystal resonator of said circuit module, a second end that is connected to a respective one of said conductive pins, and an intermediate portion that extends between said first and second ends thereof and that has a length longer than the shortest distance between said first and second ends thereof, wherein each of said conductive arms is made from a metallic material and has a low heat conductivity.

5. The oscillator as claimed in claim 4, wherein said intermediate portion of each of said conductive arms has a meandering shape.

6. The oscillator as claimed in claim 4, wherein said dielectric substrate has opposite first and second surfaces, and each of said crystal oscillator and said heating controller circuit is mounted on a respective one of said first and second surfaces of said dielectric substrate.

7. The oscillator as claimed in claim 4, wherein said circuit module is spaced apart from said cover and said base of said package module.

8. The oscillator as claimed in claim 4, wherein said oscillator is a temperature-compensated type oscillator.

* * * * *